United States Patent [19]
Campardo et al.

[11] Patent Number: 5,682,349
[45] Date of Patent: Oct. 28, 1997

[54] FAILURE TOLERANT MEMORY DEVICE, IN PARTICULAR OF THE FLASH EEPROM TYPE

[75] Inventors: Giovanni Campardo; Emilio Camerlenghi, both of Bergamo, Italy

[73] Assignee: SGS-Thomson Microelectronics, S.r.l., Agrate Brianza, Italy

[21] Appl. No.: 454,650

[22] Filed: May 31, 1995

[30] Foreign Application Priority Data

Jun. 10, 1994 [EP] European Pat. Off. ............ 94830283

[51] Int. Cl.$^6$ .................................................. G11C 11/34
[52] U.S. Cl. ...................... 365/185.29; 365/185.22; 365/189.07; 365/200; 365/210
[58] Field of Search ........................... 365/218, 200, 365/185.29, 185.22, 189.07, 210

[56] References Cited

U.S. PATENT DOCUMENTS

| | | | |
|---|---|---|---|
| 4,733,394 | 3/1988 | Giebel | 371/21 |
| 4,779,272 | 10/1988 | Kohda et al. | 365/201 |
| 5,355,339 | 10/1994 | Oh et al. | 365/200 |
| 5,426,608 | 6/1995 | Higashitani | 365/218 |

FOREIGN PATENT DOCUMENTS

| | | |
|---|---|---|
| 0403822 | 12/1990 | European Pat. Off. . |
| 0548866 | 12/1992 | European Pat. Off. . |
| 0600151 | 6/1993 | European Pat. Off. . |
| 2694404 | 7/1992 | France . |
| 4207934 | 3/1991 | Germany . |
| 2254173 | 1/1992 | United Kingdom . |
| 9407211 | 9/1993 | WIPO . |

*Primary Examiner*—Son T. Dinh
*Attorney, Agent, or Firm*—Robert Groover; Betty Formby; Matthew Anderson

[57] ABSTRACT

Since fault phenomena such as lowering of the cell gain and cell emptying occur during normal operation the present invention proposes that in the memory device the row and/or column address decoding means (RDEC,CDEC) comprise at least one non-volatile memory (NVM) for address mapping and that the reading and writing control logic (CL) comprise means (TST) designed to identify cell faults, such as low grain, in the rows and/or columns of the matrix (MAT) of the memory device and writing means (WM) designed to write on said non-volatile memory (NVM) during normal operation addresses corresponding to redundant rows and/or columns (RID) present in the matrix (MAT) to rectify said faults.

22 Claims, 3 Drawing Sheets

FAILURE TOLERANT MEMORY DEVICE, IN PARTICULAR OF THE FLASH EEPROM TYPE

CROSS REFERENCE TO RELATED APPLICATIONS

This application claims priority from EPC App'n 94830283.1, filed Jun. 10, 1994.

BACKGROUND AND SUMMARY OF THE INVENTION

The present invention relates to a memory device and in particular a flash EPROM having a) a matrix of memory cells having a plurality of rows and columns of which at least one row and/or column is redundant, b) decoding means for row and/or column addresses, and c) control logic for writing, reading and erasing of the cells and control of the device components and a method for discriminating a gain-based insulated-gate single memorization-transistor memory cell and to a method of erasing a memory cell of the same type. The memory device in accordance with the present invention can find advantageous application also in integrated circuits such as microprocessors and microcontrollers.

In the area of non-volatile semiconductor memories, presently comprising the UV_EPROM, EEPROM and flash EPROM, the memory device consists of a matrix of equal cells which comprise for the memorization of the data a single MOS transistor having at least one insulated gate. The value 0 or 1 of the data memorized depends on the amount of charges present on the insulated gate which in turn determines the threshold voltage of the MOS transistor.

As known, with the matrix must be connected row and/or column address decoding means and a control logic for reading, writing and erasure of the matrix cells.

There are often provided in the matrix one or more redundant rows and/or one or more redundant columns. These are used during manufacturing testing to obviate manufacturing defects by replacing the rows or columns containing faults with redundant rows or columns.

FIG. 1 shows a flash EPROM cell matrix with 2 rows and 3 columns.

Various well known mechanisms are used for the programming and erasure operation which can take place either globally, i.e. they affect the entire matrix, or selectively. The reading operation consists of applying to the selected cell a polarisation voltage (for writing) and detecting the corresponding current (for writing) and in comparing it with appropriate reference currents.

In particular in flash EPROM memories, reading and programming are selective while erasure is done electrically and globally.

Almost always, the programming and erasure operations take place by means of a series of identical successive phases. For programming, injection of 'hot electrons' and, for erasure, extraction of charges by the Fowler-Nordheim effect. After each individual programming or erasure phase there is a phase of verification of the charge present on the insulated gate of each cell. In this manner the charge status and consequently the threshold voltage of the individual cells can be controlled with great precision.

FIG. 2 shows in a simplified manner the gate voltage versus channel current characteristics of cells having different charge status. In particular, A0 indicates the characteristic of a cell at instant t0 having a threshold voltage VT(t0) and gain G1 while A1 indicates the characteristic of the same cell at instant t1, following t0, after an erasure phase and thus having the same gain G1 but threshold voltage VT(t1) lower than VT(t0).

The verification phase consists of a particular reading operation performed with particular reference currents more restrictive than those used for the normal reading operation.

In flash EPROM devices it is extremely important that all the cells 'experience the same history', i.e. they must be programmed and erased the same number of times. For this reason, before the actual erasure there is a programming operation of all the cells denominated 'preconditioning'.

After the 'preconditioning' operation, all the cells have a threshold voltage higher than a pre-set value VT0. The characteristic indicated by A2 in FIG. 2 having a reference gain G represents the limit of the programming condition while after the subsequent erasure operation all the cells have a threshold voltage lower than a pre-set value VT1. The characteristic indicated by A3 in FIG. 2 having the same reference gain G represents the limit of the erasure condition. The values Vt0 and VT1 depend on the manufacturing process and design choices. A possible choice could be 5V for VT0 and 2V for VT1 respectively.

Ideally all the memory cells are erased with the same speed and hence, after the erasure operation the threshold voltage values of the various cells are found all in a small area slightly below the value VT1.

During laboratory experiments and manufacturing tests some phenomena were found which degrade the performance and life of flash EPROM devices.

There are cells which are erased more rapidly than others. This phenomenon leads to the fact that when the erasure operation is completed their threshold voltage can be lowered much below VT1, as with the characteristic A5 and some times to a level, in general less than 0V as in the case of the characteristic A6, such as to become an irreversible lowering—'emptied cell' or 'depleted bit'. This can generate errors during writing operations because said cells conduct current even when they are not selected.

There are cells which are erased more slowly than others because their transconductance, and hence their gain and reading current, is lower than average. The characteristic indicated by A4 in FIG. 2 belongs to a cell of this type having gain G2. This phenomenon is found in manufacturing testing and during the life of the device and leads to the fact that when the erasure operation is terminated the cells having normal transconductance, i.e. nearly all, have reached extremely low threshold voltages often less than 0V. This leads to the shortcomings mentioned above and can also lead to degradation of a large part of the cell matrix. In addition it is also possible that the erasure operation will not end in the maximum time limits provided.

Heretofore it was sought to identify these situations and rectify them during manufacturing testing. The purpose of the present invention is to provide a method capable of identifying these situations during normal operation of the device and rectify them, in the light of the found and unexpected fact that they can arise even during the life of the device, and provide a memory device which would be tolerant of 'fault' situations like these and in particular gain lowering.

This purpose is achieved by a method for discrimination of a memory cell having the characteristics set forth in claim 1, by the method for erasing memory cells having the characteristics set forth in claim 3, and by a memory device having the characteristics set forth in claim 8. Additional advantageous aspects of the present invention are set forth in the dependent claims. In accordance with another aspect the present invention also concerns an integrated circuit having the characteristics set forth in claim 11.

Since fault phenomena such as those discussed occur during normal operation the present invention proposes that in the memory device the decoding means comprise at least one nonvolatile memory for address mapping and that the control logic comprises means for identifying cell faults in the rows and/or columns of the matrix and writing means designed for writing on said non-volatile memory during normal operation addresses corresponding to the redundant rows and/or columns to rectify said faults.

In addition it is possible to not degrade the cell matrix even in the presence of lowered gain cells by foreseeing that these will be identified and that during the erasure operation the erasure status will occur only for the non-lowered gain cells.

BRIEF DESCRIPTION OF THE DRAWING

The present invention is clarified by the following description together with the annexed drawings wherein.

DETAILED DESCRIPTION

Figure 1:
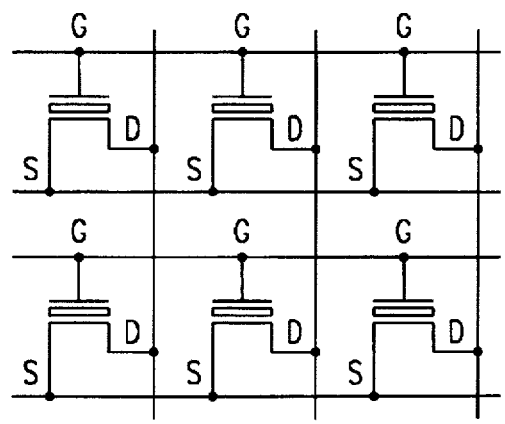
FIG. 1 shows a memory cell matrix.
Figure 2:
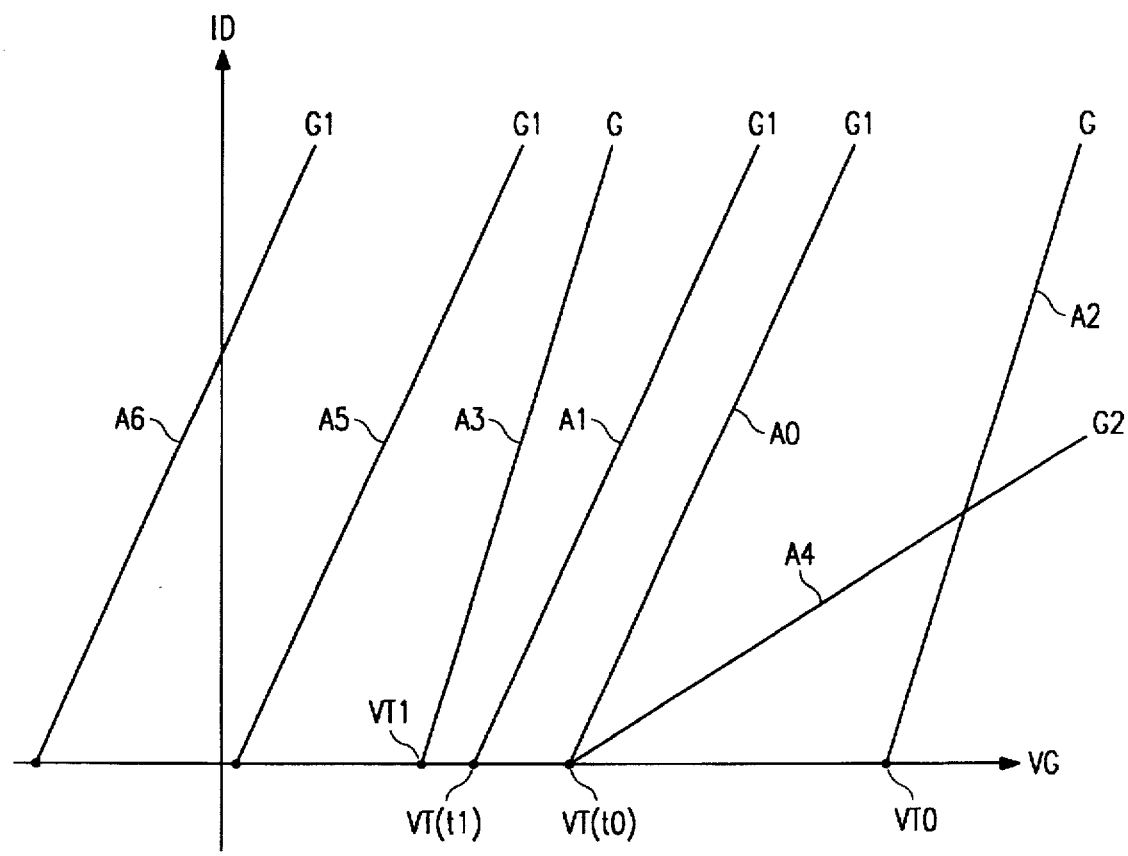
FIG. 2 shows in a simplified manner in a Cartesian voltage-current diagram the characteristics of some memory cells having different threshold voltages.
Figure 3:
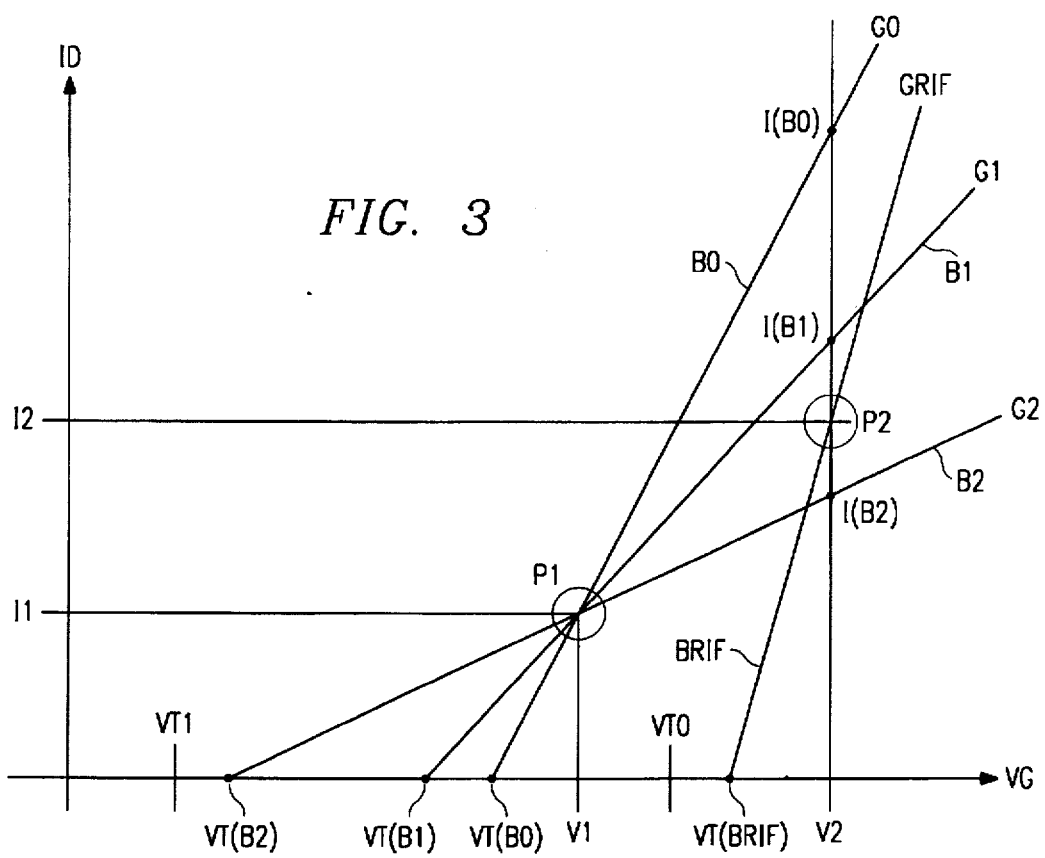
FIG. 3 shows in a simplified manner in a Cartesian voltage-current diagram the characteristics of some memory cells having different gains.

FIG. 3 shows a series of characteristics of cells all having different gains and a common point P1 identified by the coordinates V1,I1, i.e. by applying the reading voltage V1 to all these cells there is obtained therefrom the same reading current I1 and the characteristics are indicated in decreasing order of gain and threshold voltage by B0 (with gain G0 and threshold voltage VT(B0)), B1 (with gain G1 and threshold voltage VT(B1)), B2 (with gain G2 and threshold voltage VT(B2)) respectively. The Voltages Vt0 and VT1 keep the same meaning explained above.

The method in accordance with the present invention for discriminating on the basis of the gain a memory cell of the type with single insulated-gate memorization transistor comprises the following phases:

a. carry the insulated gate of the cell in a charge state such that by applying a first reading voltage V1 to the cell by means of successive programming and/or erasure and verification phases there is detected a first reading current I(V1) equal to a first value I1 (as shown in FIG. 3), b. apply a second reading voltage V2, c. detect a second reading current I(R) opposite the second reading voltage V2, d. compare the value of the second reading current I(V2) with a second value I2 which together with the second reading voltage V2 identifies a point P2, and e. associate the cell alternatively with a first or a second class of cells based on the outcome of said comparison.

Specifically for the purposes of the present invention it proved advantageous to have the second reading voltage V2, e.g. 6.25V, higher than the first reading voltage V1, e.g. 4.5V, the second value I2 higher than the first value I1, and the cell associated with a first class of high-gain cells if from said comparison it proved that said second reading current I(B) was higher than said second value I2 and otherwise with a second low-gain cell class.

Figure 4:
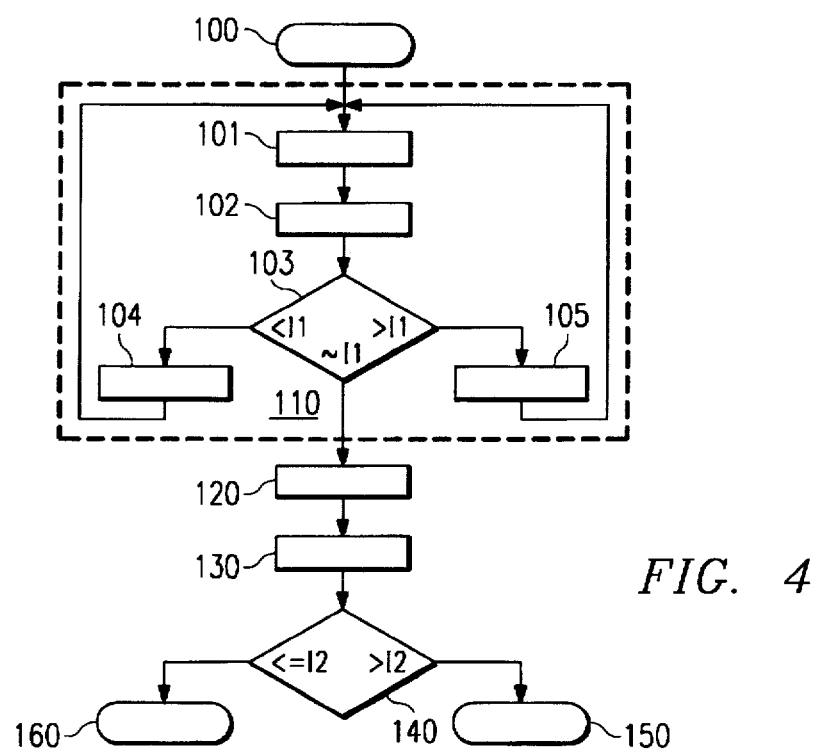
FIG. 4 shows a flow chart of a discrimination method in accordance with the present invention.

The discrimination method can be rapidly understood by considering the description made together with the flow chart shown in FIG. 4, having the following block-actions correspondence:

| 100 | method start |
| 110 | cell conditioning - phase a. of the method |
| 101 | apply V1 |
| 102 | detect I(V1) |
| 103 | test on I(V1) in relation to I1 |
| 104 | erasure phase |
| 105 | programming phase |
| 120 | apply V2 - phase b. of the method |
| 130 | detect I(V2) - phase c. of the method |
| 140 | test on I(V2) in relation to I2 - phase d. of the method |
| 150 | high-gain association - end of method phase e. |
| 160 | low-gain association - end of method phase e. |

The one shown in FIG. 3 could be the situation which appears in three cells of an EPROM flash memory device after phase a. of the method in accordance with the present invention. By applying to the three cells the second reading voltage V2 there will be detected the currents I(B0), I(B1), I(B2) respectively of which the first two are higher than the second value I2 while the last, i.e. I(B2), is not. For the purposes of the present method therefore the first three cells will be considered high-gain and the last low-gain. Graphically it can be seen that the characteristics slope reflects this situation.

It is specified lastly that the real form of the cell characteristics is not the rectilinear type but their qualitative behaviour, for the purposes of the graph and method, is the same.

It remains to be discussed how to perform practically in a physical memory device phase d. of the method, i.e. the current comparison. This can be done, e.g. by using a reference memory cell having the BRIF characteristic having a reference gain GRIF and brought to a threshold voltage VT(BRIF) such that by applying thereto the second reading voltage V2 the reading current I2 is detected, and sending to a sense amplifier the currents of the reference cell and of the cell to be discriminated. Current comparisons by means of sense amplifiers and reference cells are used normally in reading operations and in programming and erasure verification phases using appropriate reference cells. Thus to discriminate the cells on the basis of gain basically no further circuitry in the memory device is necessary.

Since the low cell gain problem becomes, as explained above, particularly dangerous for the memory device when one prepares to erase it, the ideal moment for performance of a discrimination phase is concomitantly with the erasure operation.

As explained above, a conventional erasure operation of the cells of a memory device of the insulated-gate single-transistor memorization type, in particular the EPROM flash type, consists of at least one series of successive individual erasure and verification phases of the cell erasure status.

The erasure method in accordance with the present invention comprises also at least one individual cell discrimination phase on the basis of the gain suitable for identifying the high-gain cells and provides that, after said discrimination phase, the individual verification phases affect only the high-gain cells.

In this manner it is avoided that many cells be 'depleted'.

Figure 5:
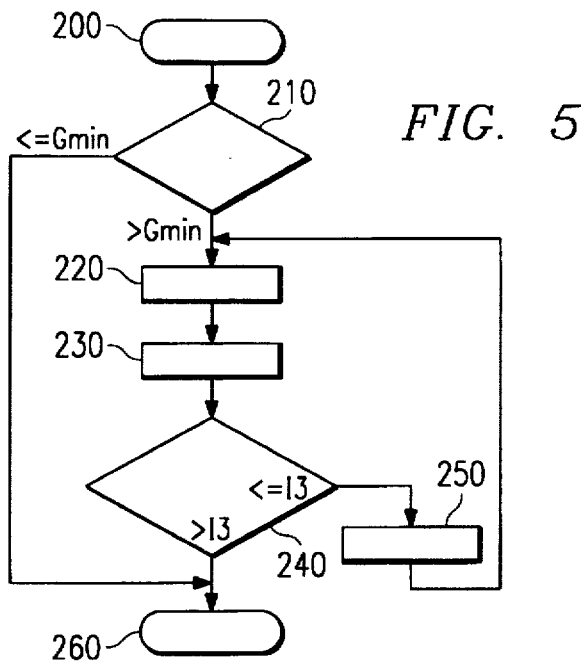
FIG. 5 shows a flow diagram of a erasure method in accordance with the present invention.

The erasure method can be rapidly understood by considering the description given together with the flow chart shown in FIG. 5 and having the following block-actions correspondence and in which V3 and I3 indicate the voltage and current respectively on the basis of which the cell erasure condition is to be verified:

| | BlockAction |
|---|---|
| 200 | method start |
| 210 | gain test of cell G compared with Gmin |
| 220 | apply V3 |
| 230 | detect I(V3) |
| 240 | test on I(V3) compared with I3 |
| 250 | erasure phase |
| 260 | method-end |

In the example of FIG. 5 the discrimination phase—block 210—precedes the actual cell erasure.

The discrimination phase can be provided by any method.

It is particularly advantageous to use the discrimination method in accordance with the present invention immediately after the 'preconditioning' and before the actual erasure because in this case, if a value of V1 lower than the value of VT0 is chosen, the discrimination phase already carries a partial but not dangerous erasure of the cells which thus shortens the actual erasure. As a whole then the erasure performed with the method of the present invention is not basically longer than that of the known art but considerably safer.

All these operations can affect the entire memory device or blocks thereof.

The cells which are not high-gain are considered faulty and possibly signalled as such to the user of the device. In a very simple case the user will avoid using them.

A more sophisticated version of the method provides that at least the faulty cells are replaced with redundant cells. More often it happens that the entire column or row to which they belong is replaced.

In this last case, for reasons of uniformity of use of all the cells of the matrix, it is well that all the redundant cells experience on average the same life as the non-redundant cells before their replacement. To achieve this it is necessary that the preconditioning and subsequent erasure affect always also the redundant cells.

It has been seen that various 'fault' phenomena affect the memory devices during their life and among these lowering of the cell gain.

Figure 6:
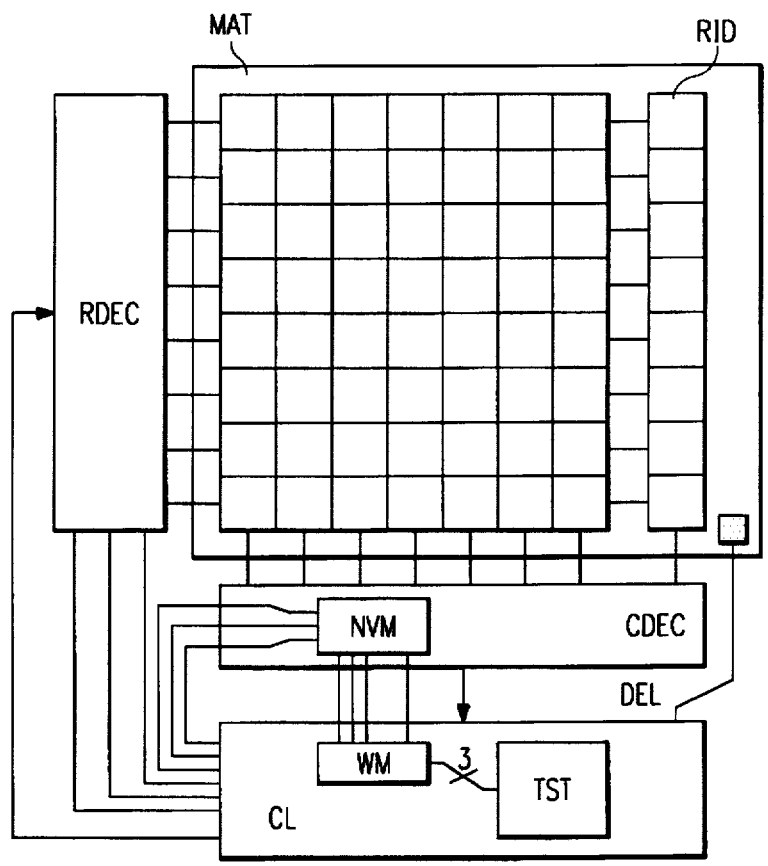
FIG. 6 shows a block diagram of a memory device in accordance with the present invention.

FIG. 6 shows an example of the memory device in accordance with the present invention which is fault tolerant. It comprises:

a.) matrix MAT of memory cells having a plurality of rows and columns of which at least one row and/or column RID is redundant, b.) decoding means RDEC,CDEC for row and/or column addresses, and c.) control logic CL for writing, reading and erasure of the cells and control of the device components.

The decoding means RDEC, CDEC comprise at least one nonvolatile memory NVM for address mapping and the control logic CL comprises means TST designed to identify cell faults in the rows and/or columns and writing means WM designed to write on the non-volatile memory NVM, during normal operation of the device, addresses corresponding to said at least one redundant row and/or column RID to rectify said faults.

In the example of FIG. 6 there is a matrix MAT made up of 8 rows and 8 columns, only one redundant column RID, a 3-bit row decoder RDEC, a 3-bit column decoder CDEC, and a nonvolatile memory NVM formed from 8 3-bit words, used only for mapping column addresses and included in the 3-bit column decoder CDEC.

From the control logic CL comes out the column address to be sent to the 3-bit column decoder CDEC, the row address to be sent to the 3-bit row decoder RDEC, and at least one signal DEL for the erasure to be sent to the matrix MAT. Furthermore it is connected to the input of the 3-bit row decoder RDEC and the input of the 3-bit column decoder CDEC. The means TST drive the writing means WM which are connected in writing to the non-volatile memory NVM.

Initially the non-volatile memory NVM contains in order the following eight words: 000, 001, 010, 011, 100, 101, 110, 111.

When the means TST identify a 'fault' among those foreseen in a particular cell, they send to the writing means WM the column address corresponding to said faulty cell, e.g. 011. The writing means WM use this address to address the nonvolatile memory NVM and use as writing data the column address corresponding to the redundancy column, in the example 111, and perform a writing operation on the non-volatile memory NVM.

At the end the non-volatile memory NVM contains in order the following eight words: 000, 001, 010, 111, 100, 101, 110, 111.

In the example there is no possibility of rectifying additional 'faults'.

The design and realisation of such a control logic CL falls within the normal activities and abilities of those skilled in the art.

It is clear that control of the entire device is entrusted to the control logic CL which can be the wired or programmed type. For erasure, this can be pre-set to operate in accordance with the method of the present invention.

The means TST can be in particular individual discrimination means for the cells of the matrix MAT which can consist of logics of the wired or programmed type and operate, e.g. in accordance with the method of the present invention.

A fault tolerant memory device in accordance with the present invention can find an advantageous application in any integrated circuit where it is necessary to store data and/or programs.

What is claimed is:

1. A method of discriminating a memory cell of the single-transistor insulated gate memorization type and in particular of the EPROM type based on gain, comprising the steps of:

a) carrying the insulated gate of the cell in a charge state such that by applying a first reading voltage to the cell by means of successive programming and/or erasure and verification phases there is detected a first reading current about equal to a first value;

b) applying a second reading voltage;

c) detecting a second reading current;

d) comparing the value of said second reading current with a second value; and e) associating the cell with a first class of cells if said second reading current is greater than said second value or with a second class of cells if said second reading current is less than said second value.

2. The method of claim 1, wherein said second reading voltage is higher than said first reading voltage and said second value is higher than said first value, and wherein said first class of cells are high-gain cells having said second reading current higher than said second value and said second class of cells are low-gain cells having said second reading current lower than said second value.

3. A method of erasing cells of a memory device of the single-transistor insulated gate memorization type and in particular the EPROM flash type, said method comprising the steps of performing at least one series of successive erasure and individual verification phases of the cell erasure state, and performing at least one individual discrimination phase of said cells to identify cells which have a gain above a threshold value;

wherein, after performing said discrimination, performing said erasure and verification only on cells which have a gain above said threshold value.

4. The method of claim 3, wherein said discrimination phase of said cells is performed before the step of erasing and verifying said cells.

5. The method of claim 3, wherein the cells not having a gain above said threshold value are considered faulty.

6. The method of claim 5, wherein at least said faulty cells are replaced by redundant cells.

7. The method of claim 6, wherein said redundant cells experience on average the same life as the non-redundant cells before said replacement.

8. A memory device, in particular flash EPROM, of the type, comprising:

a.) a matrix of memory cells having a plurality of rows and columns of which at least one row and/or column is redundant;

b.) decoding means for row and/or column addresses; and c.) control logic for writing, reading and erasing of the cells and control of the device components;

wherein said decoding means comprise at least one non-volatile memory for mapping said addresses; and wherein said control logic comprises discrimination means designed to identify cell faults in said rows and/or columns and writing means designed to write on said non-volatile memory during normal operation of said device addresses corresponding to said at least one redundant row and/or column to rectify said faults.

9. The device of claim 8, wherein said discrimination means determines which of said cells have a gain greater than a threshold value, said discrimination means being designed to drive said writing means.

10. The device of claim 9, wherein said discrimination means operates during an erasure phase.

11. An integrated circuit, comprising:

a memory device for storing data and/or programs, said memory device comprising:

a matrix of memory cells having a plurality of rows and columns of which at least one row and/or column is redundant;

decoding means for row and/or column addresses; and control logic for writing, reading and erasure of the cells and control of the device components;

wherein said decoding means comprise at least one non-volatile memory for mapping said addresses; and wherein said control logic comprises discrimination means designed to identify cell faults in said rows and/or columns and writing means designed to write on said non-volatile memory during normal operation of said device addresses corresponding to said at least one redundant row and/or column to rectify said faults.

12. The method of claim 1, wherein said step d) of comparing comprises the steps of: using a reference memory cell having a current equal to said second value when said second reading voltage is applied, and sensing the currents of said reference memory cell and the cell being discriminated using a sense amplifier.

13. The method of claim 2, wherein said low-gain cells are faulty cells, said faulty cells being replaced with redundant cells.

14. The method of claim 3, wherein said step (iv.) of comparing comprises the steps of: using a reference memory cell having a current equal to said second value when said second reading voltage is applied, and sensing the currents of said reference memory cell and the cell being discriminated using a sense amplifier.

15. The method of claim 4, wherein said second class of cells are low-gain cells having said second reading current lower than said second value, said low-gain cells being replaced by redundant cells, and wherein said preconditioning step, said step (a.) of discriminating, said step (b.) of erasing, and said step (c.) of verifying are performed on said redundant cells.

16. The device of claim 9, wherein said second reading voltage is higher than said first reading voltage, and said second value is higher than said first value.

17. The device of claim 9, wherein the value of said second reading current is compared with a second value by using a reference memory cell, said reference memory cell having a current equal to said second value when said second reading voltage is applied, wherein the currents of said reference memory cell and the cell being discriminated are sent to a sense amplifier.

18. The device of claim 9, wherein said first class of cells are high-gain cells and said second class of cells are low-gain cells, said, low-gain cells being considered faulty cells, wherein said faulty cells are replaced by redundant cells.

19. The integrated circuit of claim 11, wherein said discrimination means discriminates said cells on the basis of gain by applying a first reading voltage to said cells to detect a first reading current about equal to a first value, applying a second reading voltage to said cells to detect a second reading current, comparing the value of said second reading current with a second value, and associating each of said cells with either a first class of cells if said second reading current is higher than said second value or a second class of cells if said second reading current is lower than said second value, said discrimination means being designed to drive said writing means.

20. The integrated circuit of claim 19, wherein said second reading voltage is higher than said first reading voltage, and said second value is higher than said first value.

21. The integrated circuit of claim 19, wherein the value of said second reading current is compared with a second value by using a reference memory cell, said reference memory cell having a current equal to said second value when said second reading voltage is applied, wherein the currents of said reference memory cell and the cell being discriminated are sent to a sense amplifier.

22. The integrated circuit of claim 19, wherein said first class of cells are high-gain cells and said second class of cells are low-gain cells, said low-gain cells being considered faulty cells, wherein said faulty cells are replaced by redundant cells.

* * * * *